(12) United States Patent
Tanaka et al.

(10) Patent No.: US 11,997,787 B2
(45) Date of Patent: May 28, 2024

(54) WIRING SUBSTRATE AND METHOD OF MANUFACTURING WIRING SUBSTRATE

(71) Applicant: SHINKO ELECTRIC INDUSTRIES CO., LTD., Nagano (JP)

(72) Inventors: Hikaru Tanaka, Nagano (JP); Takashi Kasuga, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 17/573,152

(22) Filed: Jan. 11, 2022

(65) Prior Publication Data

US 2022/0225503 A1 Jul. 14, 2022

(30) Foreign Application Priority Data

Jan. 13, 2021 (JP) .................................. 2021-003743

(51) Int. Cl.
| | |
|---|---|
| *H05K 1/11* | (2006.01) |
| *H01L 21/48* | (2006.01) |
| *H01L 23/498* | (2006.01) |
| *H05K 3/38* | (2006.01) |

(52) U.S. Cl.
CPC .......... *H05K 1/113* (2013.01); *H01L 21/4857* (2013.01); *H01L 23/49822* (2013.01); *H05K 3/381* (2013.01)

(58) Field of Classification Search
CPC .......... H05K 3/381; H05K 1/113; H05K 1/11; H01L 23/49822; H01L 21/4857
USPC .......................................................... 174/59
See application file for complete search history.

(56) References Cited

U.S. PATENT DOCUMENTS

2015/0062851 A1* 3/2015 Shimizu ................. H05K 1/115
361/767
2018/0130759 A1* 5/2018 Ho .................... H01L 23/49811

FOREIGN PATENT DOCUMENTS

| EP | 1635625 A2 * | 3/2006 | ....... H01L 23/49827 |
|---|---|---|---|
| JP | 2019-125709 | 7/2019 | |
| JP | 2019-186243 | 10/2019 | |

\* cited by examiner

*Primary Examiner* — Tremesha S Willis
(74) *Attorney, Agent, or Firm* — Rankin, Hill & Clark LLP

(57) ABSTRACT

A wiring substrate includes: a wiring layer; an insulating layer that is laminated on the wiring layer; an opening portion that passes through the insulating layer to the wiring layer; and an electric conductor film that is formed at the opening portion of the insulating layer. A surface of the insulating layer includes a smoothed portion that is not covered by the electric conductor film, and a roughened portion that includes an inner wall surface of the opening portion covered by the electric conductor film and that have surface roughness that is greater than surface roughness of the smoothed portion.

14 Claims, 18 Drawing Sheets

WIRING SUBSTRATE AND METHOD OF MANUFACTURING WIRING SUBSTRATE

CROSS-REFERENCE TO RELATED APPLICATION

This application is based upon and claims the benefit of priority of the prior Japanese Patent Application No. 2021-003743, filed on Jan. 13, 2021, the entire contents of which are incorporated herein by reference.

FIELD

The embodiment discussed herein is related to a wiring substrate and a method of manufacturing a wiring substrate.

BACKGROUND

Conventionally, some wiring substrate on which, for example, a semiconductor chip is mounted has a multi-layer wiring structure that is formed by using, for example, a semi-additive process. Specifically, a wiring layer is formed by performing electroless plating and electrolytic plating on an insulating layer, and furthermore, an insulating layer that covers the wiring layer is formed. In this way, by repeatedly laminating the insulating layers and the wiring layers, a wiring substrate having the multi-layer wiring structure is formed.

In the wiring substrate having the above described structure, a via that passes through the insulating layer as needed is provided, and wiring patterns on different wiring layers are electrically connected. Furthermore, a wiring layer that is disposed at the outermost layer of the multi-layer wiring structure is covered by a solder resist layer having an insulation property. Then, a connection terminal that passes through the solder resist layer as needed is provided, so that the wiring layer that is present in the outermost layer is electrically connected to an electronic component, such as a semiconductor chip, that is mounted on the solder resist layer.

Each of vias and the connection terminals is formed by forming an opening portion on the insulating layer or the solder resist layer, forming a seed layer by performing an electroless plating on the surface of the insulating layer or the solder resist layer including the inner wall surface of the opening portion, and performing the electrolytic plating on the seed layer. The electrolytic plating is performed by masking a portion other than a portion in which the via or the connection terminal is formed by using, for example, a dry film resist (DFR). After having performed the electrolytic plating, the DFR is removed, and the seed layer that is exposed to the unneeded portion is removed by etching.

Patent Document 1: Japanese Laid-open Patent Publication No. 2019-125709

Patent Document 2: Japanese Laid-open Patent Publication No. 2019-186243

However, there is a problem in that, on the wiring substrate described above, connection reliability between the via and the connection terminal is not sufficient. Specifically, when the seed layer in the unneeded portion is removed by etching, the seed layer in the base portions of the via and the connection terminal is etched by side etching, so that an undercut occurs. This is because an etching solution that is used to etch the seed layer has a property of isotropic nature, the seed layer in the unneeded portion is etched in the thickness direction of the seed layer and also, at the same time, etched in the direction along the surface of the seed layer, resulting in the vicinity of the base of the via and the connection terminal being dissolved from lateral side.

An amount of the undercut varies according to a period of etching time; therefore, it is conceivable to shorten the period of etching time to reduce the amount of the undercut. However, in this case, the seed layer in the unneeded portion is not sufficiently removed, and a short circuit may possibly occur in the wiring pattern. Therefore, in general, the period of etching time is made longer than the period of time taken to remove all of the seed layer in the unneeded portion in the thickness direction in order to reliably prevent a short circuit occurring in the wiring pattern. As a result, side etching is increased and the undercut is increased accordingly.

Furthermore, if the undercut is increased, a range of motion of the via and the connection terminal is increased, so that the electricity connection of the via and the connection terminal with respect to the wiring layer becomes unstable. In other words, the connection reliability of the wiring layer on the wiring substrate is thus decreased.

SUMMARY

According to an aspect of an embodiment, a wiring substrate includes: a wiring layer; an insulating layer that is laminated on the wiring layer; an opening portion that passes through the insulating layer to the wiring layer; and an electric conductor film that is formed at the opening portion of the insulating layer. A surface of the insulating layer includes a smoothed portion that is not covered by the electric conductor film, and a roughened portion that includes an inner wall surface of the opening portion covered by the electric conductor film and that have surface roughness that is greater than surface roughness of the smoothed portion.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of a wiring substrate and a method of manufacturing the wiring substrate disclosed in the present invention will be explained in detail below with reference to the accompanying drawings. Furthermore, the present invention is not limited to the embodiments.

Figure 1:
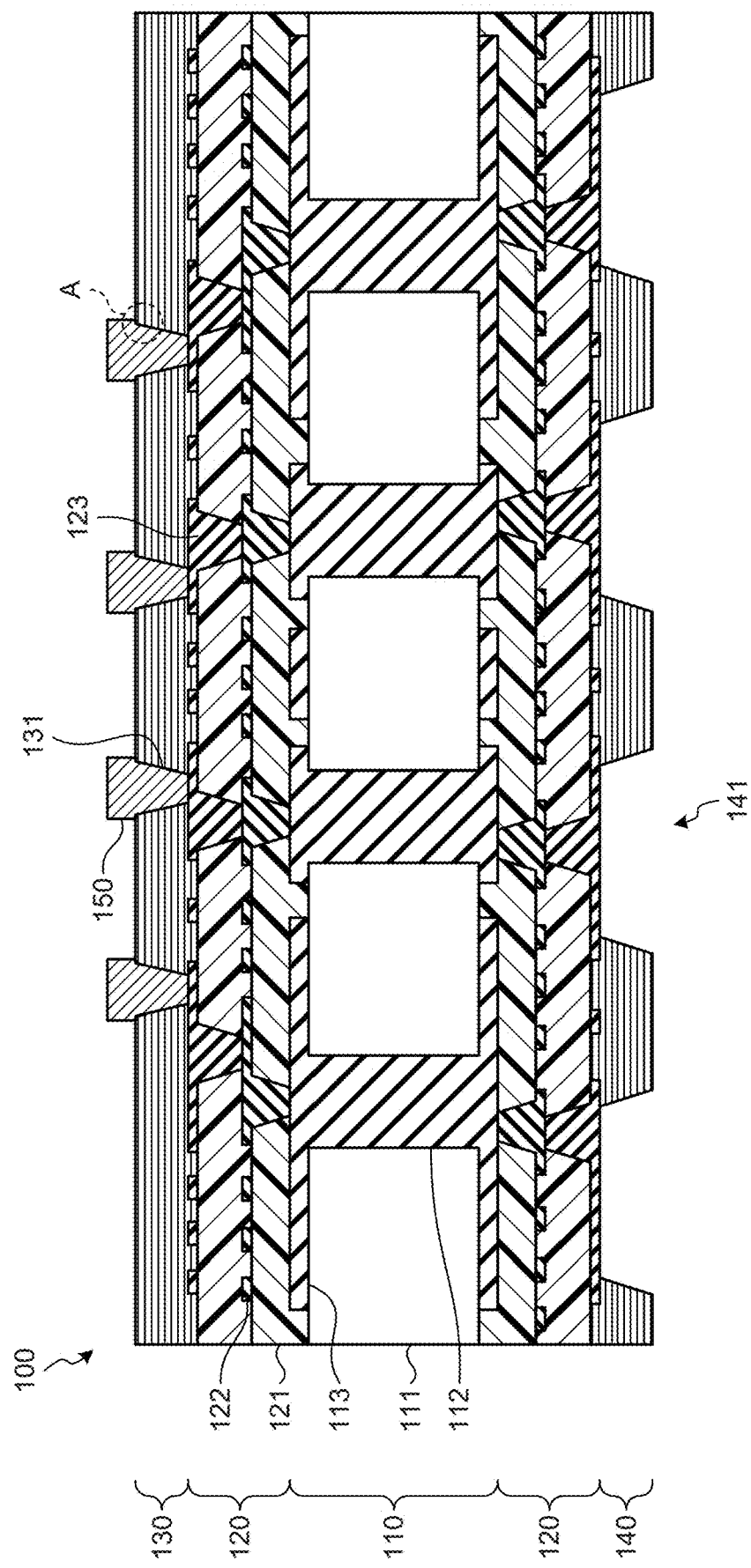
FIG. 1 is a diagram illustrating a configuration of a wiring substrate according to one embodiment.

FIG. 1 is a diagram illustrating a configuration of a wiring substrate 100 according to one embodiment. FIG. 1 illustrates a schematic cross-sectional view of the wiring substrate 100. The wiring substrate 100 illustrated in FIG. 1 may be used as a substrate of a semiconductor device on which, for example, a semiconductor chip is mounted.

The wiring substrate 100 has a laminated structure and includes a core substrate 110, a multi-layer wiring structure 120, and solder resist layers 130 and 140. In the following, a description will be made on the assumption that, as illustrated in FIG. 1, the solder resist layer 140 is the lowermost layer and the solder resist layer 130 is the uppermost layer; however, the wiring substrate 100 may be used by, for example, vertically inverting the surfaces, or may be used in an arbitrary orientation.

The core substrate 110 is obtained by forming wiring layers 113 on both surfaces of a base material 111, which is an insulating material having a plate shape, by performing metal plating thereon. The wiring layers 113 provided on both of the surfaces of the base material 111 are connected, as needed, by respective feedthrough wirings 112 that pass through the base material 111.

The multi-layer wiring structure 120 is constituted by laminating an insulating layer 121 having an insulation property and a wiring layer 122 having conductivity. The insulating layer 121 has thermal resistance formed of, for example, an epoxy resin, a polyimide resin, a cyanate resin, or the like, and is formed by using an insulating resin having a non-photosensitive and thermosetting property. Furthermore, the wiring layer 122 is formed by using, for example, metal, such as copper or copper alloy. In FIG. 1, two layers are laminated inside the multi-layer wiring structure 120 that is formed on an upper side of the core substrate 110, whereas two layers are laminated inside the multi-layer wiring structure 120 that is formed on a lower side of the core substrate 110; however, the number of layers to be laminated may be one, or three or more. The wiring layers 113 and 122 that are adjacent with each other by way of the insulating layer 121 are connected by respective vias 123 each of which passes through the insulating layer 121 as needed. The insulating layer 121 is formed by using a resin material having the non-photosensitive and thermosetting property, so that it is possible to form an opening portion that is used to form each of the vias 123 by performing laser beam machining. Then, as will be described later, the surface of the insulating layer 121 is roughened in the vicinity of the vias 123 and the inner wall surface of the opening portion in which each of the vias 123 is formed.

The solder resist layer 130 is a layer that covers the wiring layer 122 that is the uppermost layer of the multi-layer wiring structure 120 and that protects the wiring. The solder resist layer 130 is a layer that is formed of an insulating resin that has a non-photosensitive and thermosetting property and that has thermal resistance formed of, for example, an epoxy resin, a polyimide resin, a cyanate resin, or the like, and that is one of the insulating layers.

A portion on the side of the solder resist layer 130 of the wiring substrate 100 is the surface on which an electronic component, such as a semiconductor chip, is mounted. Opening portions 131 are formed on the solder resist layer 130 at the position in which the semiconductor chip is mounted. The solder resist layer 130 is formed by using a non-photosensitive and thermosetting resin, so that it is possible to form each of the opening portions 131 by performing laser beam machining. Then, connection terminals 150 each of which connects the wiring layer 122 included in the multi-layer wiring structure 120 to an electrode of the semiconductor chip are formed at the respective opening portions 131. As will be described later, the surface of the solder resist layer 130 is roughened in the vicinity of the inner wall surface of each of the opening portions 131 and the connection terminals 150.

Similarly to the solder resist layer 130, the solder resist layer 140 is a layer that covers the wiring layer 122 on the surface of the multi-layer wiring structure 120 and that protects the wiring. The solder resist layer 140 is a layer that is formed of an insulating resin that has a non-photosensitive and thermosetting property and that has thermal resistance formed of, for example, an epoxy resin, a polyimide resin, a cyanate resin, or the like, and that is one of the insulating layers.

A portion on the side of the solder resist layer 140 of the wiring substrate 100 is the surface that is connected to an external component, a device, or the like. At a position at which an external connection terminal that is electrically connected to an external component or a device is formed, opening portions 141 are formed on the solder resist layer 140, and the wiring layer 122 included in the multi-layer wiring structure 120 is exposed from the opening portions 141. An external connection terminal, such as a solder ball, is formed at each of the opening portions 141. The solder resist layer 140 is formed by using a non-photosensitive and thermosetting resin, so that it is possible to form the opening portions 141 by performing laser beam machining.

Figure 2:
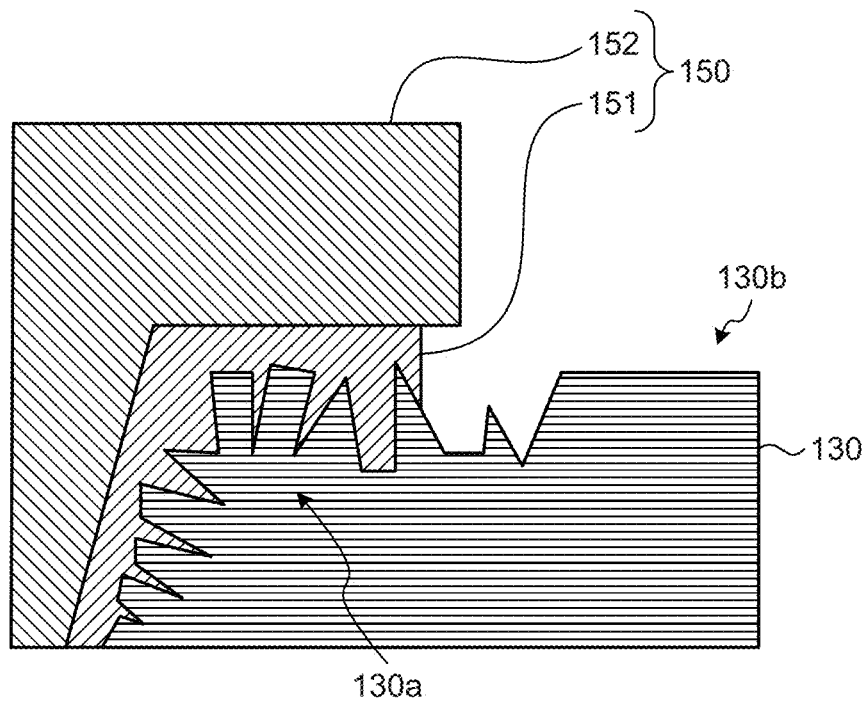
FIG. 2 is a diagram illustrating an enlarged portion of a connection terminal.

FIG. 2 is a diagram illustrating an enlarged portion indicated by the symbol A illustrated in FIG. 1. FIG. 2 illustrates a portion in the vicinity of the boundary between the connection terminal 150 and the solder resist layer 130.

As illustrated in FIG. 2, the connection terminal 150 includes a seed layer 151 that is an electroless plating film formed by performing electroless plating and a post 152 that is an electrolytic plating film formed on the seed layer 151 by performing electrolytic plating. Furthermore, in the vicinity of a position at which the connection terminal 150 is formed, the surface of the solder resist layer 130 is roughened and a roughened portion 130a is formed. A portion at the other position on the surface of the solder resist layer 130 is flat and smooth and a smoothed portion 130b is formed. The seed layer 151 that constitutes the connection terminal 150 is formed at the roughened portion 130a by being subjected to electroless plating. A creepage distance of the roughened portion 130a per unit length in a direction parallel to the surface of the solder resist layer 130 is longer than that of the smoothed portion 130b, so that an amount of side etching of the seed layer 151 is reduced and an undercut around the post 152 is also reduced.

In other words, a portion associated with the unneeded portion on the seed layer is formed at the smoothed portion 130b, and, when the seed layer is removed by a process of etching, the seed layer 151 that constitutes the connection terminal 150 is subjected to side etching. At this time, the creepage distance of the roughened portion 130a on which the seed layer 151 is formed is long, so that the progress of the side etching in the direction parallel to the surface of the solder resist layer 130 is relatively slow, and an amount of the lower portion of the post 152 and the seed layer 151 to be dissolved is accordingly small. As a result, an undercut of the connection terminal 150 is small and it is thus possible to improve connection reliability between the connection terminal 150 and the wiring layer 122.

Figure 3:
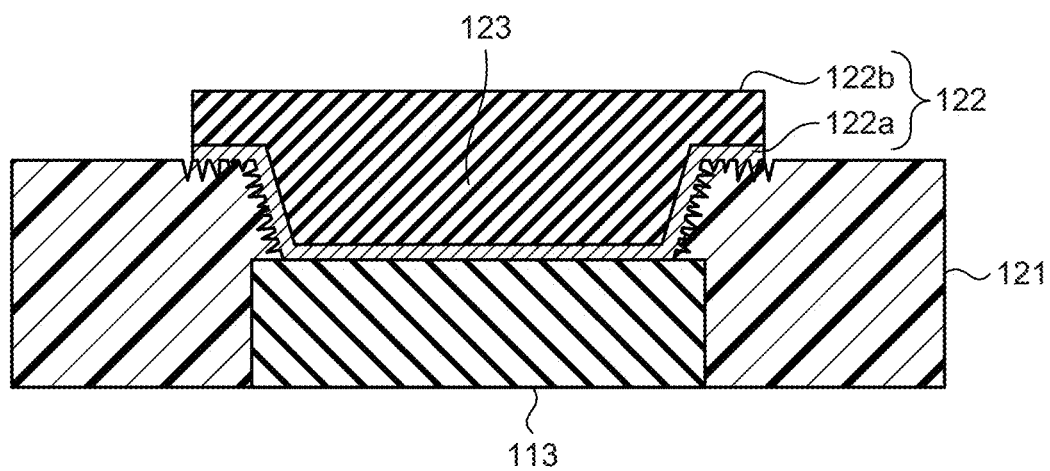
FIG. 3 is a diagram illustrating by enlarging a portion near a via.

Furthermore, here, a configuration of the connection terminal 150 has been described; however, similarly to the connection terminal 150, the vias 123 that pass through the insulating layer 121 and the wiring layer 122 around each of the vias 123 are also formed of a seed layer and an electrolytic plating layer. Specifically, for example, as illustrated in FIG. 3, at a position at which the via 123 is formed, the wiring layer 122 is constituted by a seed layer 122a and an electrolytic plating layer 122b. The via 123 is formed by filling electrolytic plating in the seed layer 122a performed inside the opening portion of the insulating layer 121. The wiring layer 122 and the vias 123 formed in this way is formed by performing, for example, a semi-additive process.

Then, in the vicinity of the position at which the vias 123 are formed, a roughened portion is formed on the surface of the insulating layer 121. In other words, the vicinity of the inner wall surface of the opening portion of the insulating layer 121 on which each of the vias 123 is formed is roughened, the seed layer 122a is formed so as to cover the roughened portion. The vias 123 are formed by being subjected to electrolytic plating on the seed layer 122a, so that it is possible to reduce an undercut of the via 123 and improve connection reliability between the via 123 and the wiring layer 113 (or, the wiring layer 122 disposed on the lower side of the layer).

Figure 4:
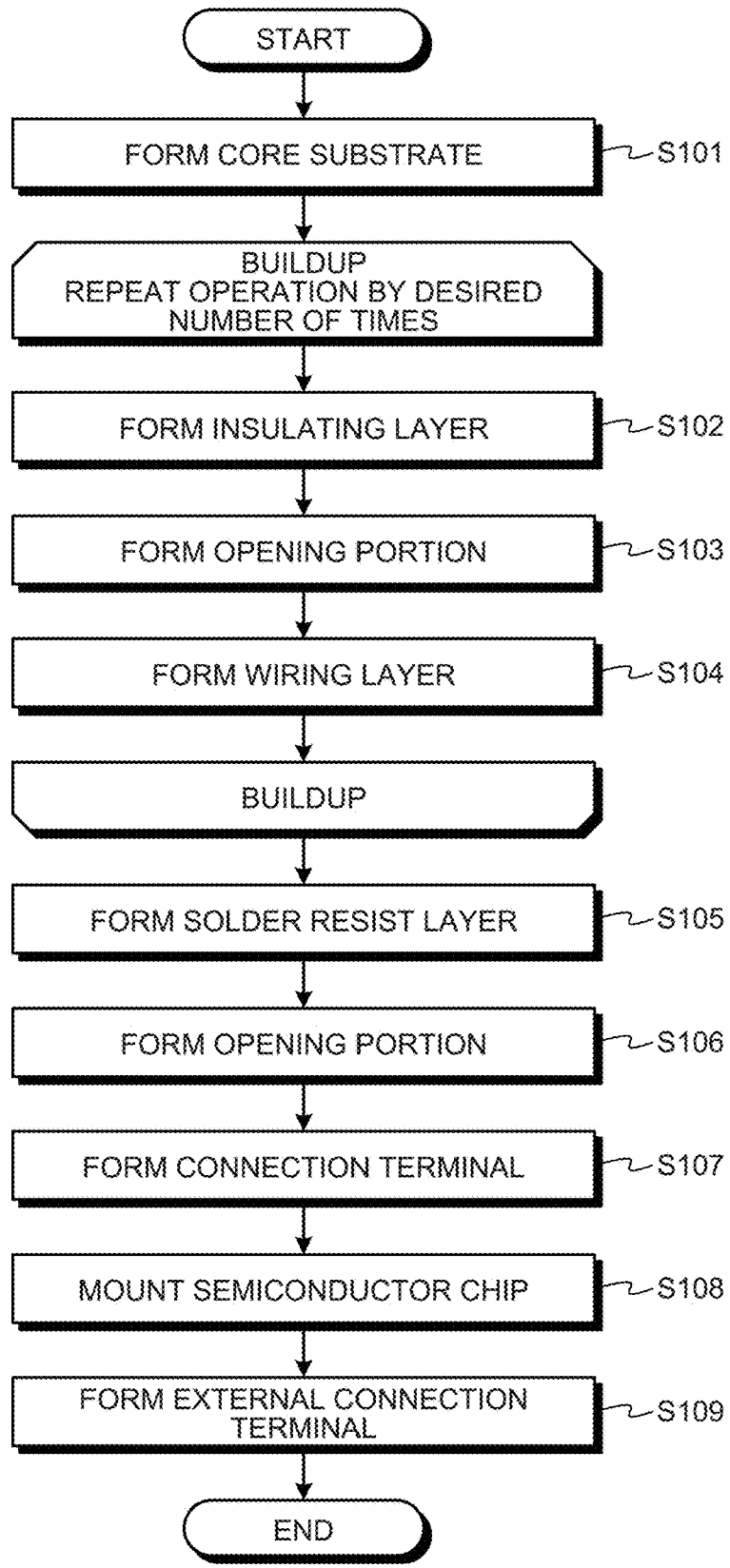
FIG. 4 is a flowchart illustrating a method of manufacturing a semiconductor device according to one embodiment.

In the following, a method of manufacturing a semiconductor device having the wiring substrate 100 configured described above will be described, by using specific example, with reference to the flowchart illustrated in FIG. 4.

Figure 5:
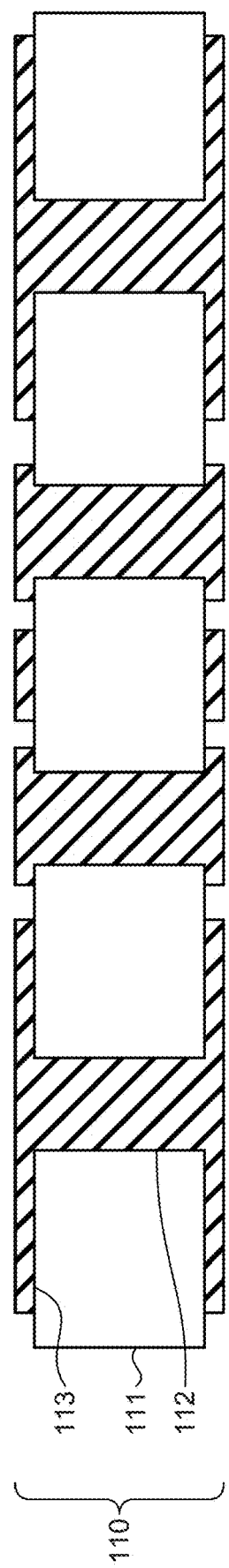
FIG. 5 is a diagram illustrating a specific example of a forming step of a core substrate.

First, the core substrate 110 that serves as a support member of the wiring substrate 100 is formed (Step S101). Specifically, for example, as illustrated in FIG. 5, the feedthrough wiring 112 that passes through the base material 111 is formed on each of the base materials 111 each of which is an insulating material having a plate shape, the wiring layers 113 made of metal, such as copper or copper alloy is formed on both surfaces of the base material 111 by performing a process of, for example, a copper foil or copper plating. The wiring layers 113 disposed on both surfaces of the base material 111 are connected, as needed, by the respective feedthrough wirings 112 that are formed by performing plating on metal, such as copper or copper alloy. The base material 111 used may be, for example, a material obtained by impregnating a reinforcement material, such as a glass woven fabric, with an insulating resin, such as an epoxy resin. The reinforcement material used may be, in addition to the glass woven fabric, a glass non-woven fabric, an aramid woven fabric, an aramid non-woven fabric, or the like. Furthermore, in addition to the epoxy resin, the insulating resin used may be a polyimide resin, a cyanate resin, or the like.

Figure 6:
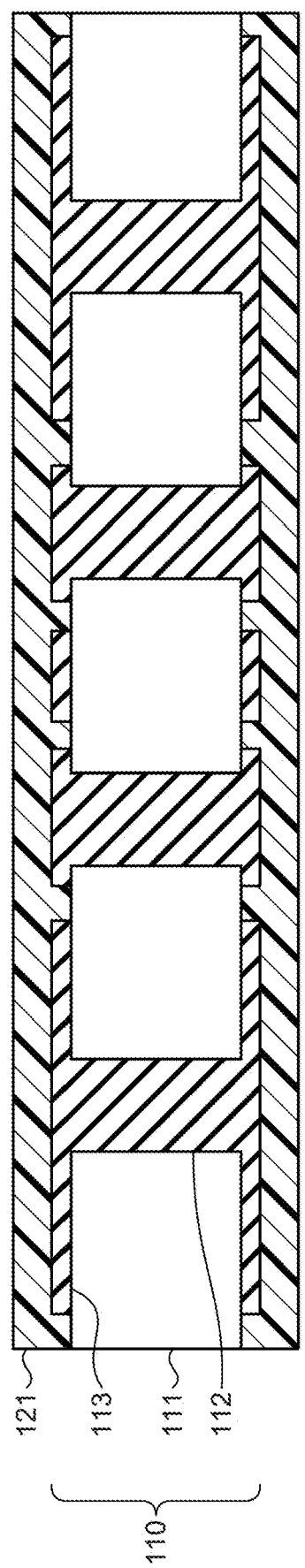
FIG. 6 is a diagram illustrating a specific example of a forming step of an insulating layer.

Then, the multi-layer wiring structure 120 is formed on the upper surface and the lower surface of the core substrate 110 by using a buildup technique. Specifically, for example, as illustrated in FIG. 6, first, the insulating layer 121 is formed on the upper surface and the lower surface of the core substrate 110 (Step S102). In other words, the insulating layer 121 that is formed of a resin that has a non-photosensitive and thermosetting property and that has thermal resistance formed of, for example, an epoxy resin, a polyimide resin, a cyanate resin, or the like, is formed on the wiring layer 113 of the core substrate 110.

Figure 7:
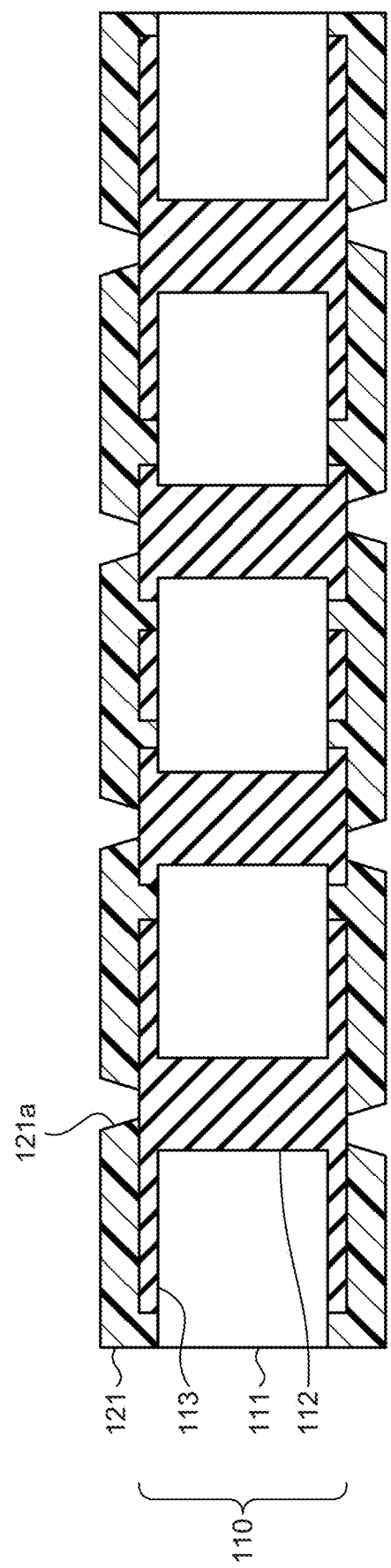
FIG. 7 is a diagram illustrating a specific example of a forming step of an opening portion.

At the position at which the via 123 of the insulating layer 121 is formed, the opening portion is formed (Step S103). In other words, for example, as illustrated in FIG. 7, an opening portion 121a that passes through the insulating layer 121 and that allows the wiring layer 113 to be exposed from the bottom surface is formed. At this time, because the insulating layer 121 is formed of the non-photosensitive resin, the opening portion 121a is formed by performing laser beam machining. For the laser beam machining, for example, a $CO_2$ laser, a UV laser, or the like is used, the surface of the insulating layer 121 is irradiated with a laser such that the temperature of the surface of the insulating layer 121 is at least higher than a glass transition temperature of the resin that constitutes the insulating layer 121. In other words, when the opening portion 121a is formed, the inner wall surface of the opening portion 121a and around thereof is irradiated with a laser having an energy that changes the properties of the material of the insulating layer 121, and then, the inner wall surface of the opening portion 121a and a surrounding area become brittle.

When the opening portion 121a is formed in the insulating layer 121, a desmear process is performed in order to remove a resin residue. In other words, the resin residue remaining inside the opening portion 121a and the surrounding area is removed by using, for example, a potassium permanganate solution. At this time, because the inner wall surface of the opening portion 121a and the surrounding area is brittle, if these portions are immersed in a chemical solution that is used for the desmear process, the surface of the insulating layer 121 is roughened and the surface roughness is increased. The surface roughness of the inner wall surface of the opening portion 121a and the surrounding area is about, for example, 3 to 10 times larger than the surface roughness of the portion that is not brittle due to laser irradiation.

Then, the wiring layer 122 is formed on the insulating layer 121 on which the opening portion 121a is formed (Step S104). The wiring layer 122 is formed by performing, for example, a semi-additive process. In this case, a seed layer is formed on the surface of the insulating layer 121 including the inner wall surface of the opening portion 121a by performing a process of, for example, electroless copper plating. Then, a plating resist layer having an opening at a portion, at which the wiring pattern is formed, is formed on the seed layer. Then, for example, electrolytic copper plating is performed on the seed layer that is exposed from the opening of the plating resist layer and an electrolytic plating layer is formed. Then, the plating resist layer is removed. Thereafter, by removing the seed layer exposed from the electrolytic plating layer by using a process of etching, the wiring layer 122 having a desired wiring pattern is formed.

Figure 8:
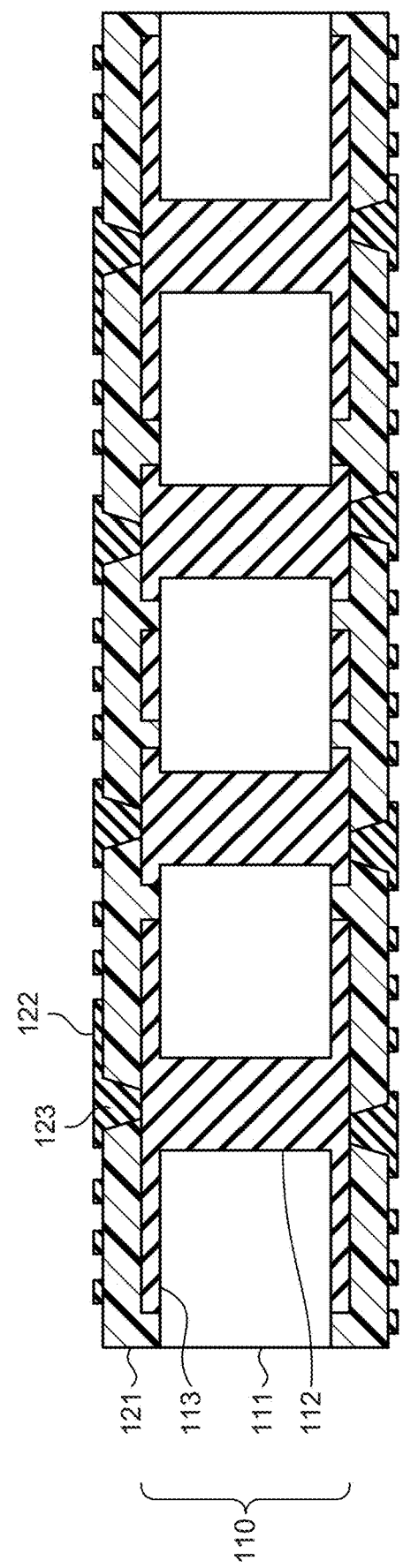
FIG. 8 is a diagram illustrating a specific example of a forming step of a wiring layer.

At this time, for example, as illustrated in FIG. 8, at the opening portion 121a of the insulating layer 121, the via 123 that passes through the insulating layer 121 is formed by filling electrolytic copper plating, and the wiring layer 122 and the wiring layer 113 of the core substrate 110 are electrically connected. Furthermore, after the wiring pattern has been formed by electrolytic copper plating, a portion associated with the unneeded portion on the seed layer in which the wiring pattern is not formed is removed by etching; however, the surface of the insulating layer 121 is roughened in the surrounding area of the via 123, so that an amount of side etching of the seed layer that forms the via 123 is small. As a result, an undercut around the via 123 becomes small, and it is thus possible to improve the connection reliability due to the via 123. Furthermore, the seed layer may be formed by sputtering metal, such as copper. The seed layer that is formed by performing electroless plating or sputtering or the electrolytic plating layer is an example of an electric conductor film.

Figure 9:
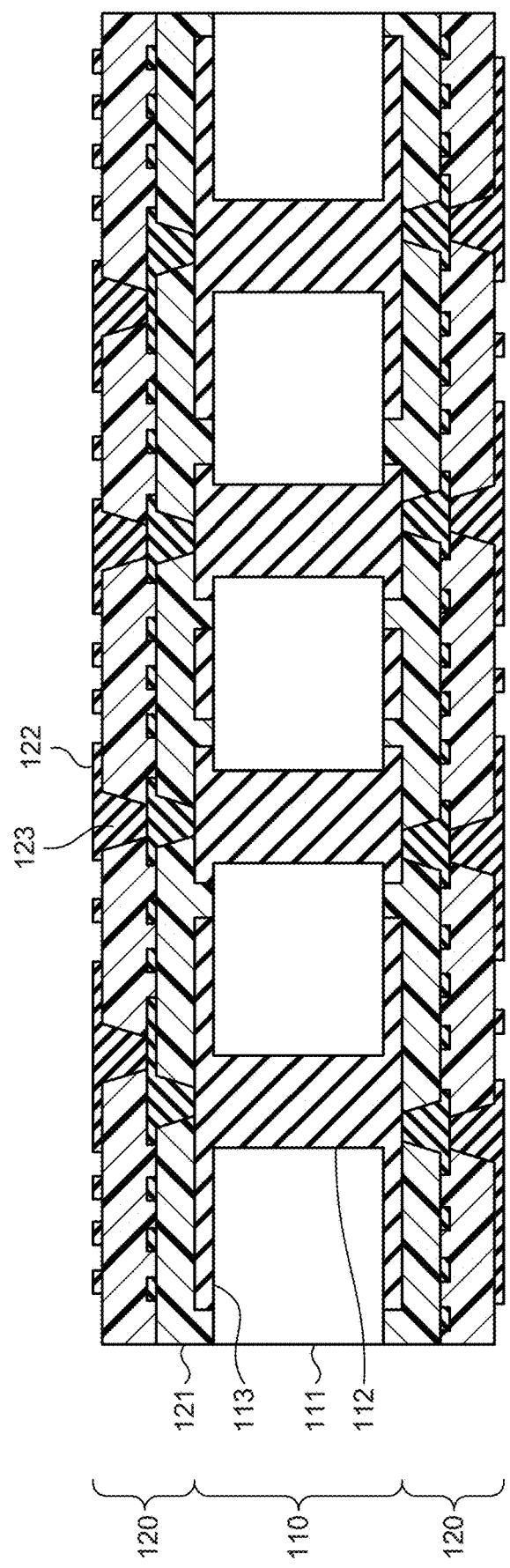
FIG. 9 is a diagram illustrating a specific example of a multi-layer wiring structure.

By repeatedly performing the process of forming the insulating layers 121, the opening portion 121a, and the wiring layers 122 described above by the number of requested times, the insulating layers 121 and the wiring layers 122 are sequentially laminated, and then, the multi-layer wiring structure 120 is formed. In the following, for example, as illustrated in FIG. 9, a description will be made on the assumption that each of the two layers of the insulating layers 121 and the wiring layers 122 is formed on the upper and the lower surfaces of the core substrate 110. In the surrounding area of each of the vias 123 illustrated in FIG. 9, the surface of the insulating layer 121 is roughened; therefore, an undercut around the vias 123 is small and the connection reliability is improved accordingly.

If the multi-layer wiring structure 120 is formed by using the buildup technique, the wiring layer 122 on the surface of the multi-layer wiring structure 120 is covered by the solder resist layers 130 and 140 (Step S105). In other words, the wiring layer 122 on the surface of the multi-layer wiring structure 120 laminated on the upper surface of the core substrate 110 is covered by the solder resist layer 130, and the wiring layer 122 on the surface of the multi-layer wiring structure 120 laminated on the lower surface of the core substrate 110 is covered by the solder resist layer 140. The solder resist layers 130 and 140 are formed of a resin, as a material, that has a non-photosensitive and thermosetting property and that has thermal resistance formed of, for example, an epoxy resin, a polyimide resin, a cyanate resin, or the like.

Figure 10:
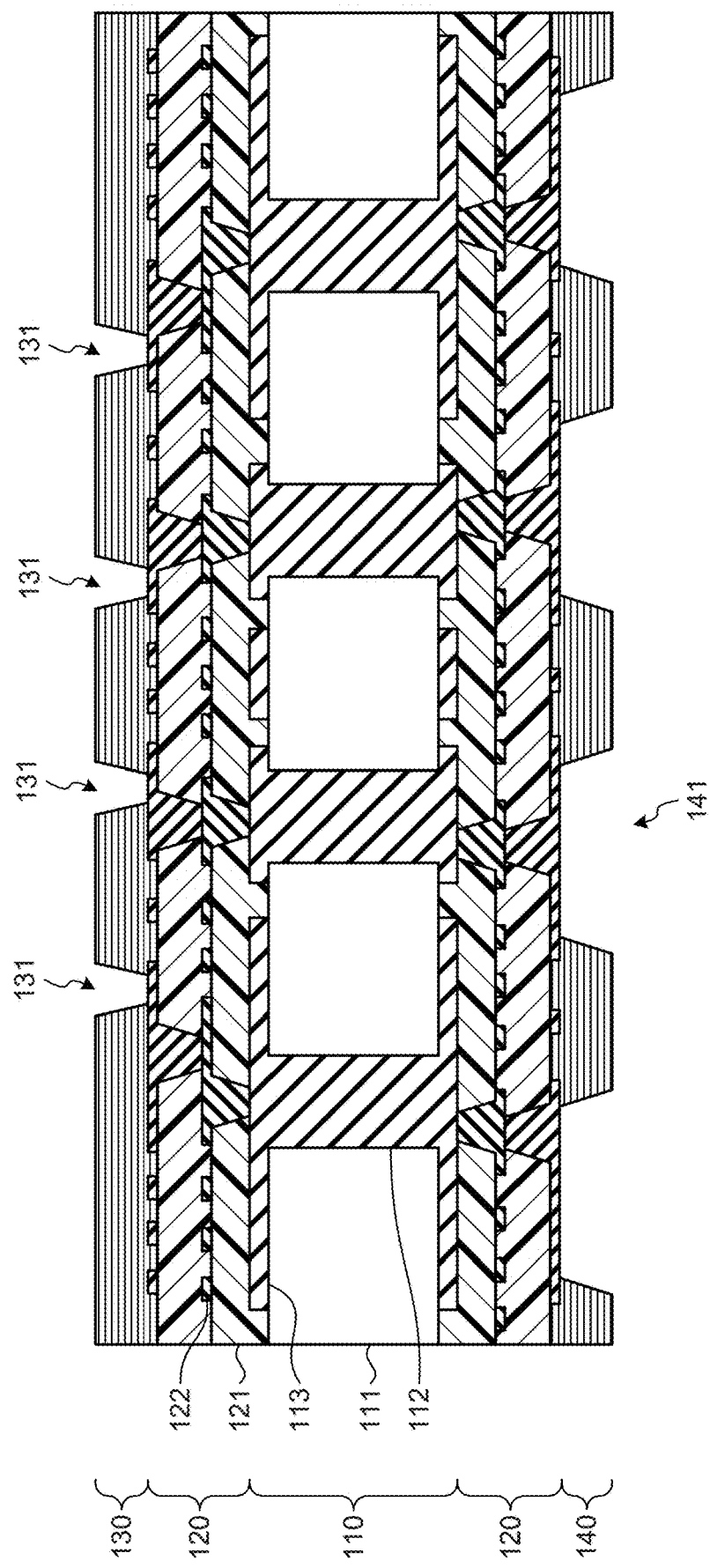
FIG. 10 is a diagram illustrating a specific example of a forming step of a solder resist layer.

Then, for example, as illustrated in FIG. 10, on the solder resist layer 130 that is on the side in which the semiconductor chip is mounted, the opening portion 131 is formed at a position at which the connection terminal 150 connected to the semiconductor chip is provided (Step S106). The wiring layer 122 that is the uppermost layer of the multi-layer wiring structure 120 is exposed from the bottom surface of the opening portion 131. In contrast, the opening portion 141 is formed at a position at which the external connection terminal is provided, on the solder resist layer 140 that is on the side to which an external component or a device is connected. The wiring layer 122 that is the lowermost layer of the multi-layer wiring structure 120 is exposed from the bottom surface of the opening portion 141.

The solder resist layers 130 and 140 are formed of a non-photosensitive resin, so that the opening portions 131 and 141 are formed by performing laser beam machining. For the laser beam machining, for example, a $CO_2$ laser, an UV laser, or the like is used, the surface of each of the solder resist layers 130 and 140 is irradiated with a laser such that the temperature of the surface of the solder resist layers 130 and 140 is at least higher than a glass transition temperature of the resin that constitutes the solder resist layers 130 and 140. In other words, when the opening portions 131 and 141 are formed, the inner wall surface of the opening portions 131 and 141 and the surrounding area is irradiated with a laser having an energy that converts the properties of the material of the solder resist layers 130 and 140, and the inner wall surface of each of the opening portions 131 and 141 and the surrounding area become brittle.

When the opening portions 131 and 141 are formed on the solder resist layers 130 and 140, respectively, a desmear process is performed in order to remove a resin residue. In other words, for example, a resin residue remaining inside the opening portions 131 and 141 and the surrounding area is removed by using a potassium permanganate solution. At this time, because the inner wall surface of each of the opening portions 131 and 141 and the surrounding area is brittle, if these portions are immersed in the chemical solution that is used for the desmear process, the surface of each of the solder resist layers 130 and 140 is roughened and the surface roughness is increased. The surface roughness of the inner wall surface of the opening portions 131 and 141 and the surrounding area is about, for example, 3 to 10 times larger than the surface roughness of the portion that is not brittle due to laser irradiation.

Figure 11:
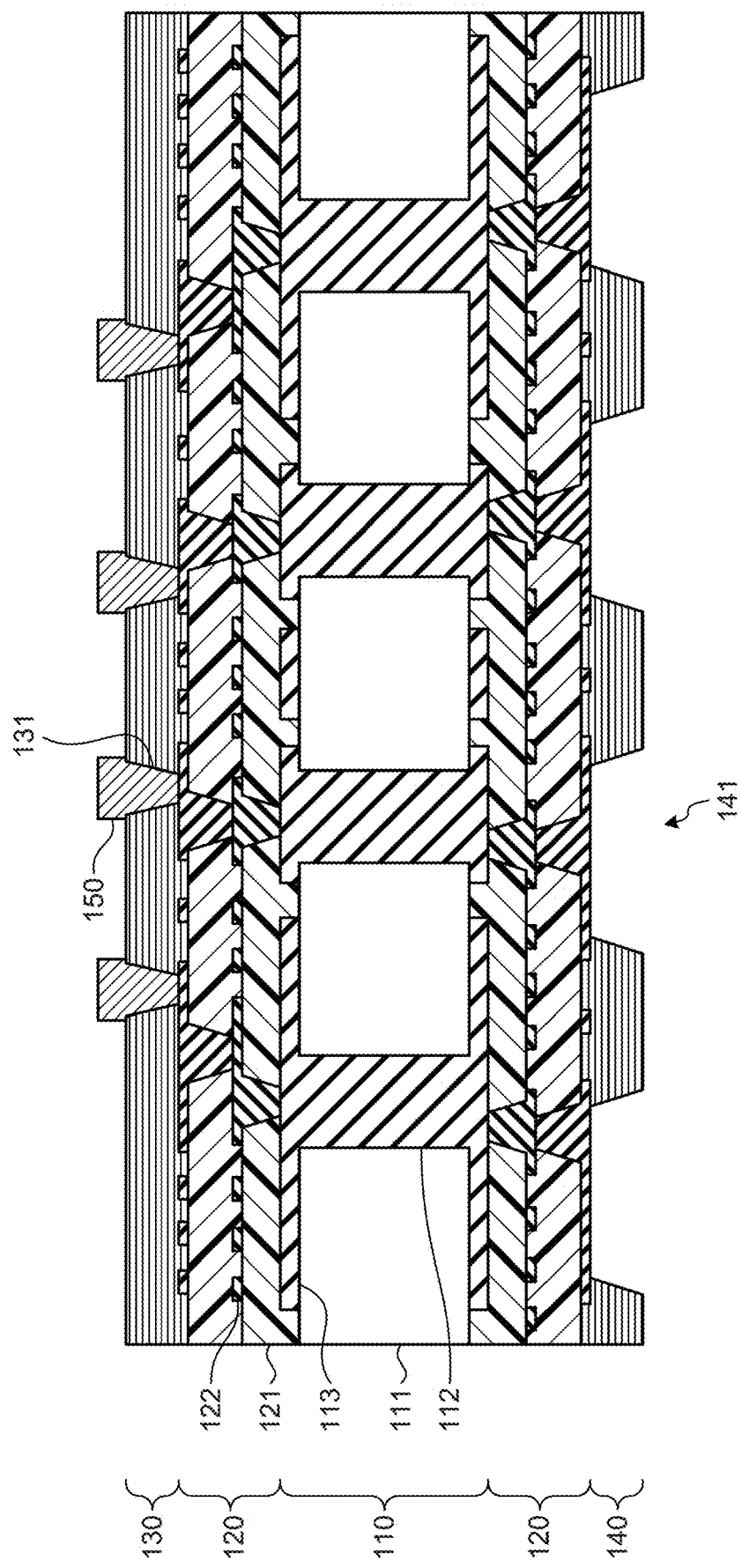
FIG. 11 is a diagram illustrating a specific example of a forming step of a connection terminal.

Then, the connection terminal 150 is formed at the opening portion 131 of the solder resist layer 130 (Step S107). In other words, a seed layer is formed by performing, for example, electroless copper plating on the surface of the solder resist layer 130, and then, for example, electrolytic copper plating is performed on the seed layer at a position of the opening portion 131, so that the connection terminal 150 constituted by the seed layer 151 and the post 152 is formed. The connection terminal 150 is connected to, for example, as illustrated in FIG. 11, the wiring layer 122 that is the uppermost layer of the multi-layer wiring structure 120 at a position of the opening portion 131 of the solder resist layer 130. Furthermore, the seed layer may be formed by sputtering metal, such as copper. The seed layer that is formed by performing electroless plating or sputtering or the electrolytic plating layer is an example of an electric conductor film.

At the time of forming the connection terminal 150, after the post 152 has been formed on the seed layer 151 by performing electrolytic copper plating, a portion associated with the unneeded portion on the seed layer is removed by performing etching; however, the surface of the solder resist layer 130 is roughened in the surrounding area of the opening portion 131, so that an amount of side etching of the seed layer 151 is small. As a result, an undercut around the connection terminal 150 is small, and it is thus possible to improve the connection reliability due to the connection terminal 150. Furthermore, a method of forming the connection terminal 150 will be described in detail later.

By forming the connection terminal 150, the wiring substrate 100 is completed. Then, the semiconductor chip is mounted on the solder resist layer 130 side of the wiring substrate 100 (Step S108), and the connection terminal 150 is connected to the electrode of the semiconductor chip.

Figure 12:
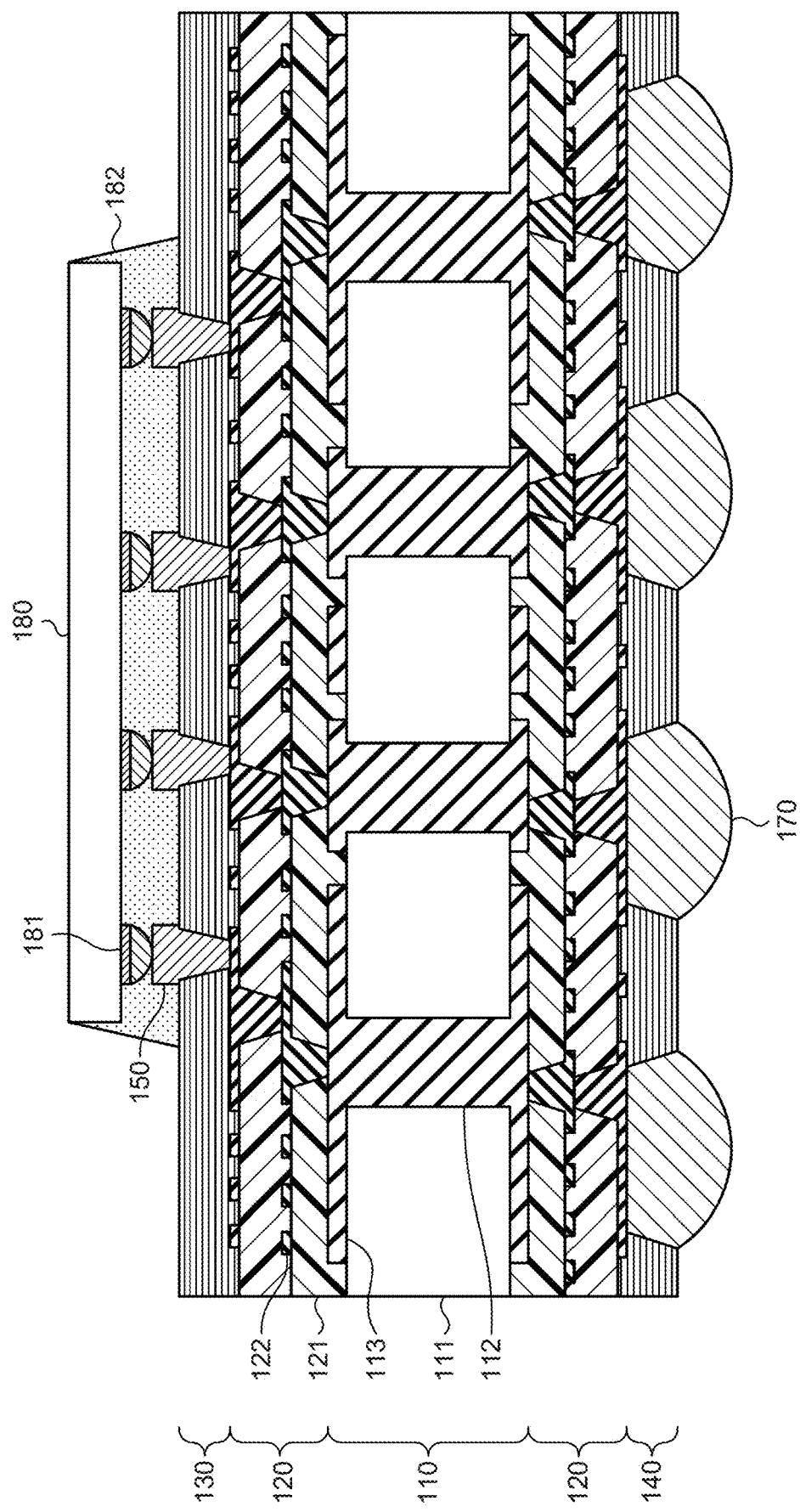
FIG. 12 is a diagram illustrating a specific example of a mounting step of a semiconductor chip.

Specifically, for example, as illustrated in FIG. 12, a semiconductor chip 180 is mounted on an upper side of the connection terminals 150. Electrodes 181 of the semiconductor chip 180 are bonded to the respective connection terminals 150 by, for example, soldering or the like, and the bonding portions between the associated electrodes 181 and the connection terminals 150 are sealed by an underfill resin 182, so that the semiconductor chip 180 is packaged on the wiring substrate 100. Then, external connection terminals, such as solder balls 170, are formed on the opening portion 141 of the solder resist layer 140 (Step S109). Furthermore, the step of mounting the semiconductor chip 180 and the step of forming the external connection terminal described above may be performed in reverse order. Furthermore, a portion of the wiring layer 122 exposed from the opening portion 141 of the solder resist layer 140 may be an external connection terminal without providing the solder balls 170.

Figure 13:
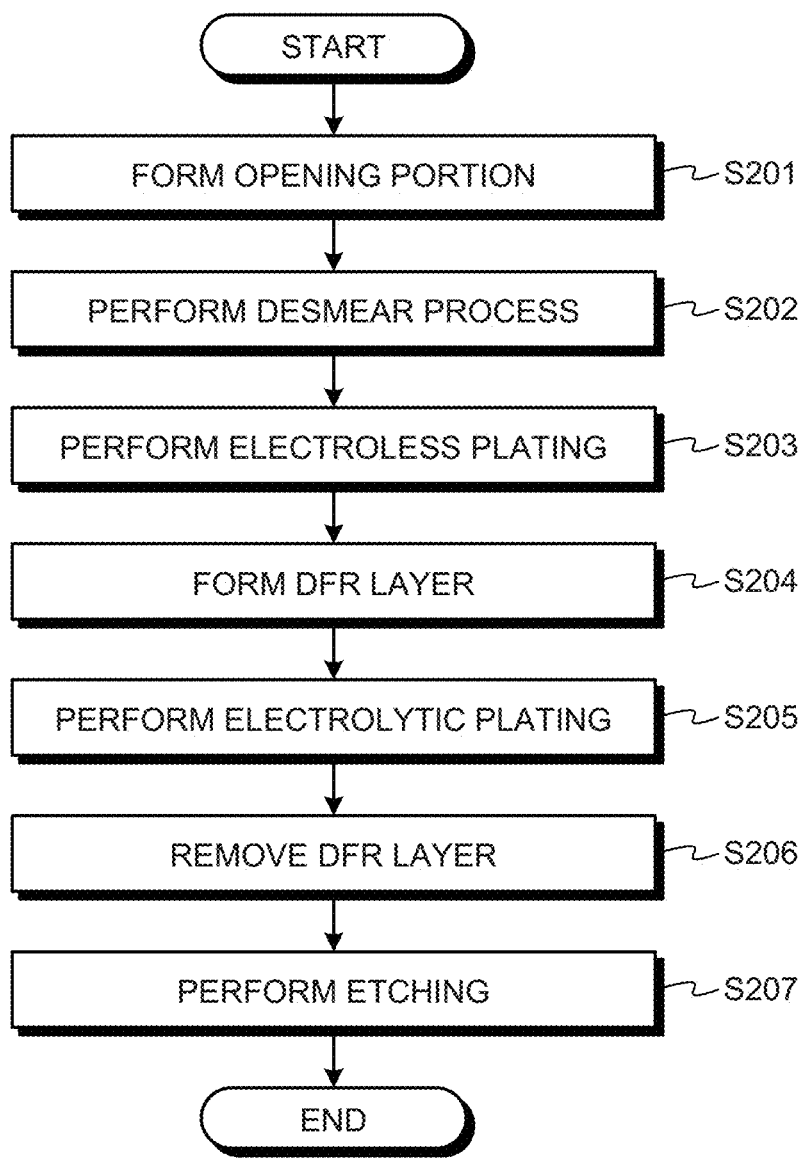
FIG. 13 is a flowchart illustrating a forming step of a connection terminal.
Figure 14:
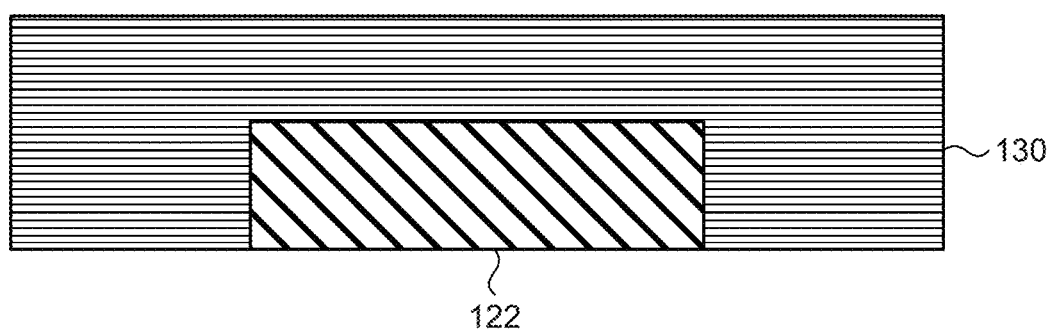
FIG. 14 is a diagram illustrating an enlarged portion of a solder resist layer.

In the following, a forming step of the connection terminal 150 will be more specifically described with reference to the flowchart illustrated in FIG. 13. Here, for example, as illustrated in FIG. 14, a description will be made of a method of forming the connection terminals 150 on the solder resist layer 130 that covers the wiring layer 122 of the uppermost layer of the multi-layer wiring structure 120. However, it is also possible to use the same method in a case where the vias 123 are formed on the insulating layer 121.

Figure 15:
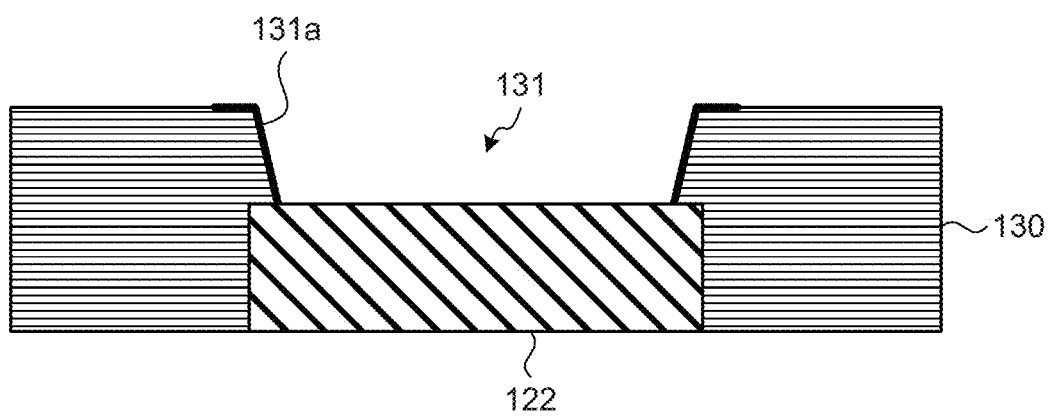
FIG. 15 is a diagram illustrating a specific example of a forming step of an opening portion.

If the solder resist layer 130 is formed by using a non-photosensitive insulating resin, the opening portion 131 is formed on the solder resist layer 130 (Step S201). Specifically, for example, as illustrated in FIG. 15, a position at which the wiring pattern of the wiring layer 122 is disposed is irradiated with a laser, such as a $CO_2$ laser, an UV laser, so that the opening portion 131 is formed in the solder resist layer 130. At this time, since a laser having relatively a high energy is irradiated such that the temperature of the surface of the solder resist layer 130 is at least higher than a glass transition temperature of the resin that constitutes the solder resist layer 130, the resin that is present on an inner wall surface 131a of the opening portion 131 and in the surrounding area is changed in quality and becomes brittle. In FIG. 15, the portion in which the quality of the resin is changed is indicated by a thick line.

Figure 16:
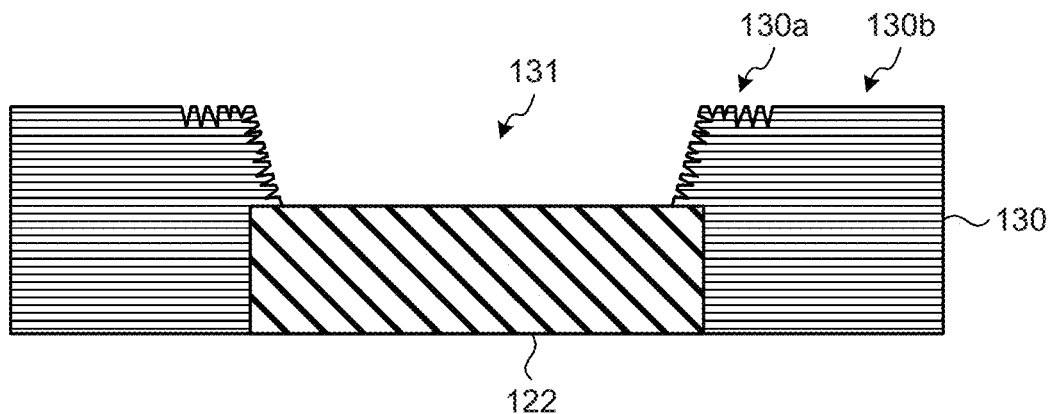
FIG. 16 is a diagram illustrating a specific example of a desmear processing step.

Then, the desmear process is performed in order to remove a resin residue remaining on the bottom surface or the inner wall surface 131a of the opening portion 131 and the surrounding area of the opening portion 131 (Step S202). In other words, for example, inside the opening portion 131 and the surrounding area of the opening portion 131 are rinsed by a chemical solution, such as a potassium permanganate solution. The inner wall surface 131a of the opening portion 131 and the surrounding area of the opening portion 131 are brittle due to laser irradiation; therefore, for example, as illustrated in FIG. 16, if these portions are immersed in the chemical solution, these portions are roughened. In other words, in the surrounding area of the opening portion 131, the roughened portion 130a is formed on the surface of the solder resist layer 130, and the surface roughness is larger than the surface roughness of the smoothed portion 130b that is the other portion.

Specifically, the arithmetic average roughness Ra that represents the surface roughness of the smoothed portion 130b is about, for example, 60 to 100 nm, whereas the arithmetic average roughness Ra of the roughened portion 130a is about, for example, 300 to 600 nm. Therefore, the surface roughness of the roughened portion 130a is about, for example, 3 to 10 times larger than the surface roughness of the smoothed portion 130b. The ratio of the surface roughness of the roughened portion 130a to the surface roughness of the smoothed portion 130b is one example; however, it is preferable that the surface roughness of the roughened portion 130a be in the range of 1.5 to 50 times larger than the surface roughness of the smoothed portion 130b. The surface roughness of the roughened portion 130a is increased, so that, the creepage distance of the roughened portion 130a per unit length in a direction parallel to the surface of the solder resist layer 130 is increased. In other words, the creepage distance of the roughened portion 130a per unit length is about, for example, 3 to 10 times longer than the creepage distance of the smoothed portion 130b per unit length.

Figure 17:
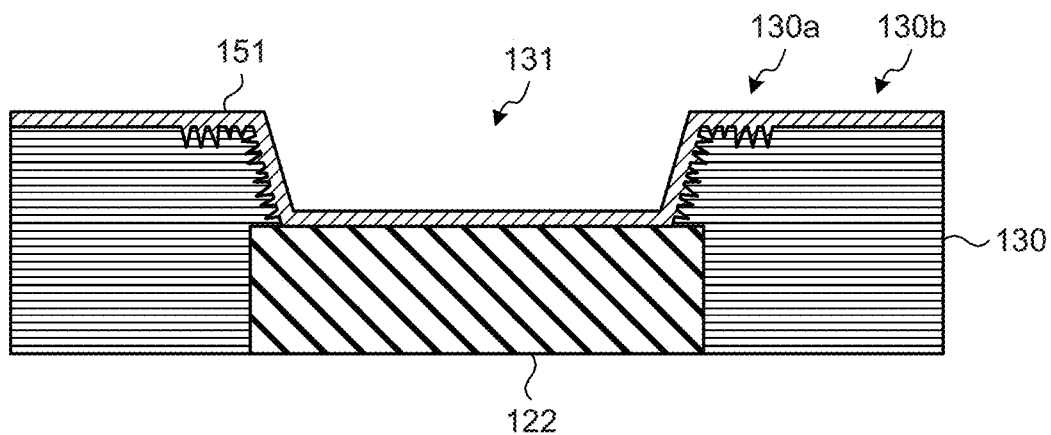
FIG. 17 is a diagram illustrating a specific example of an electroless plating step.

If the roughened portion 130a is formed in the surrounding area of the opening portion 131 in this way, the seed layer 151 is formed by performing electroless plating (Step S203). Specifically, for example, as illustrated in FIG. 17, the seed layer 151 is formed by performing, for example, electroless copper plating on the surface of the solder resist layer 130 including the roughened portion 130a and the smoothed portion 130b. The thickness of the seed layer 151 is about, for example, 0.5 to 1.5 μm.

Figure 18:
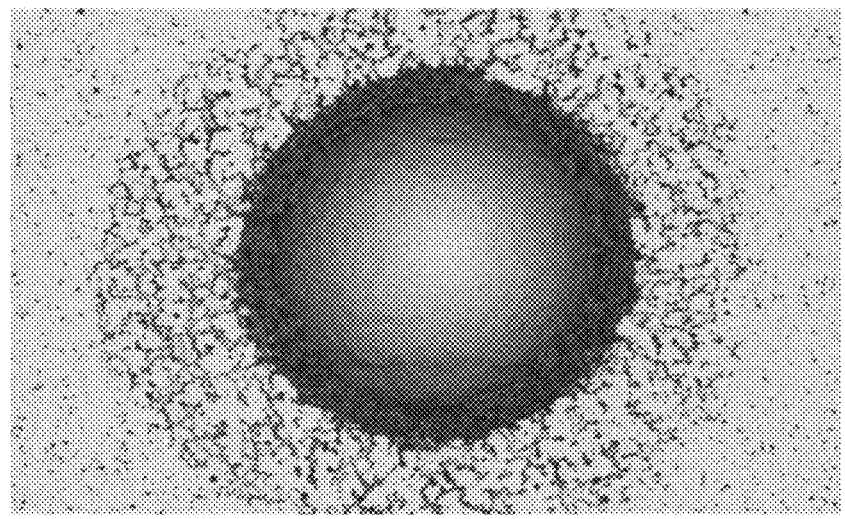
FIG. 18 is a diagram illustrating an external appearance of a surface of a seed layer.

The seed layer 151 covers the upper surface of the wiring layer 122, the roughened portion 130a, and the smoothed portion 130b. An external appearance of the seed layer 151 viewed from above is an image illustrated in, for example, FIG. 18. In other words, a portion that covers the roughened portion 130a including the inner wall surface of the opening portion 131 spreads around a portion that covers the upper surface of the wiring layer 122 that is located at the center, and furthermore, a portion that covers the smoothed portion 130b spreads around the portion that covers the roughened portion 130a. Furthermore, the seed layer 151 may be formed by sputtering metal, such as copper.

Figure 19:
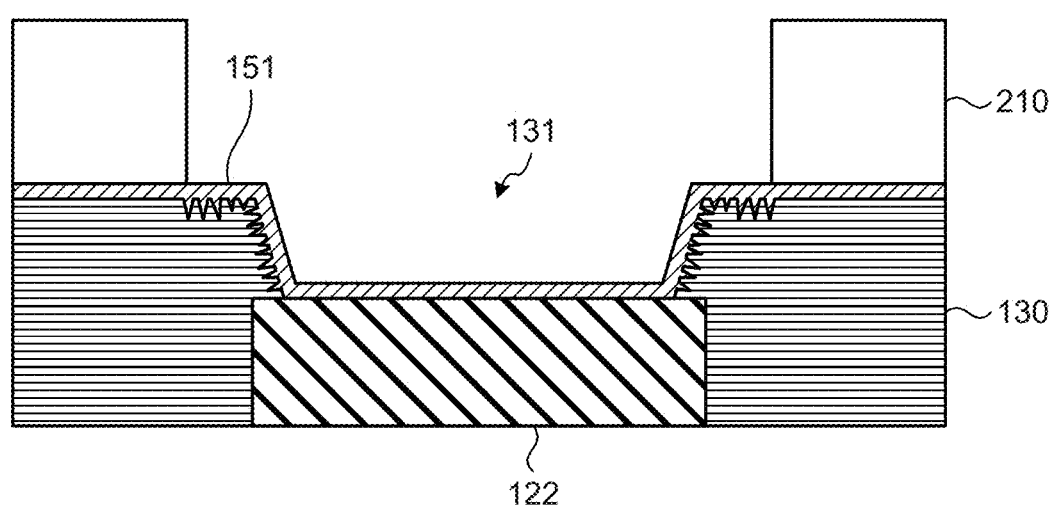
FIG. 19 is a diagram illustrating a specific example of a forming step of a DFR layer.

When the seed layer 151 is formed, a dry film resist (DFR) layer that serves as a mask of electrolytic plating is formed (Step S204). In other words, the DFR is laminated on the seed layer 151, and exposure and image development is performed in accordance with the position of the connection terminal 150, so that, for example, as illustrated in FIG. 19, DFRs 210 are formed on the seed layer 151 at a portion other than the position at which the connection terminal 150 is formed.

Figure 20:
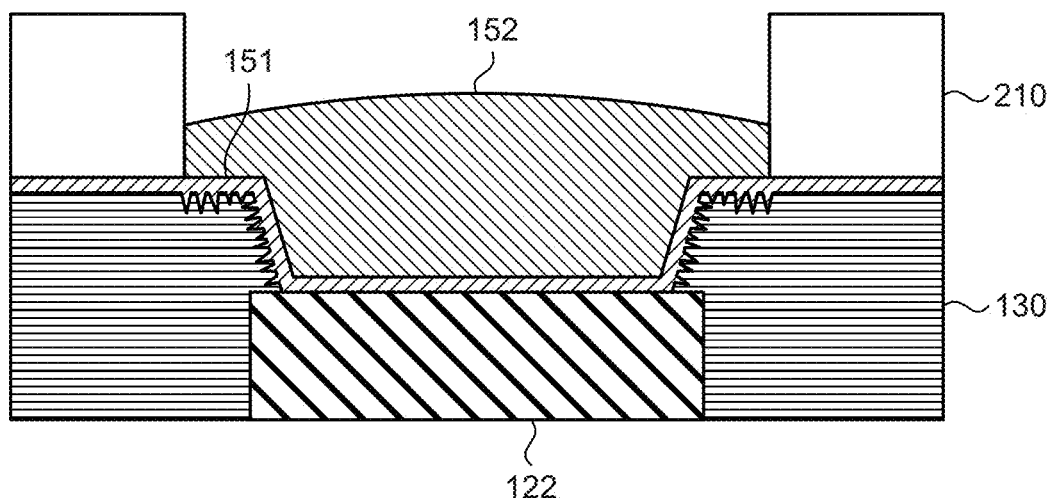
FIG. 20 is a diagram illustrating a specific example of an electrolytic plating step.

Then, by performing electrolytic plating, the post 152 is formed on the seed layer 151 (Step S205). Specifically, for example, by performing electrolytic copper plating by using a copper sulfate plating solution, copper is deposited to the portion in which the DFR 210 is not formed, and, for example, as illustrated in FIG. 20, the post 152 is formed on the seed layer 151. At this time, inside the opening portion 131 is filled by electrolytic plating.

Figure 21:
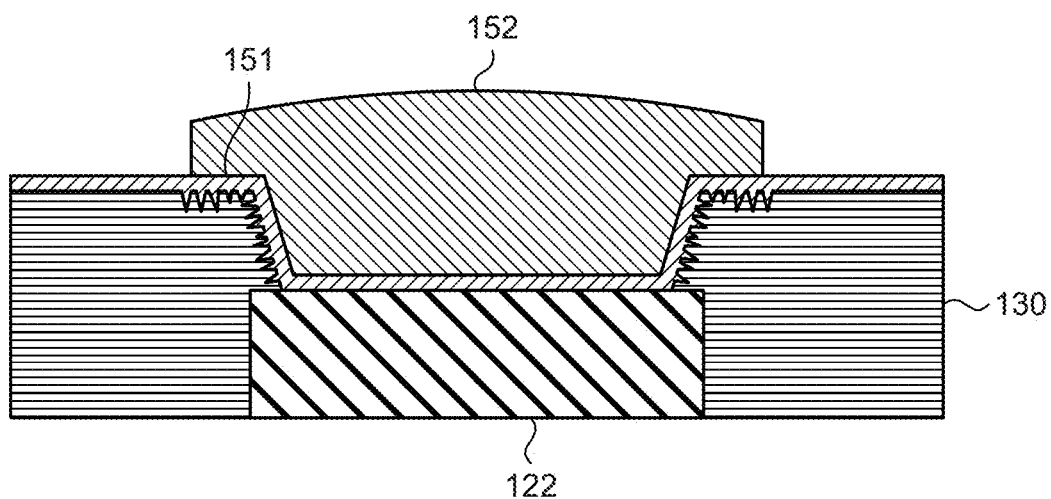
FIG. 21 is a diagram illustrating a specific example of a removal step of a DFR layer.

When the post 152 is formed, the DFRs 210 are removed (Step S206). To remove the DFRs 210, for example, sodium hydroxide or an amine-based alkaline stripping solution is used. By removing the DFR 210, for example, as illustrated in FIG. 21, the post 152 protrudes from the solder resist layer 130, and enters the state in which the post 152 is connected to the wiring layer 122 by way of the seed layer 151. At this stage, the seed layer 151 remains the entire surface and the post 152 makes a short circuit with another post; therefore, there is a need to remove the seed layer 151 corresponding to a portion that is associated with the unneeded portion on the seed layer and that does not overlap with the post 152.

Figure 22:
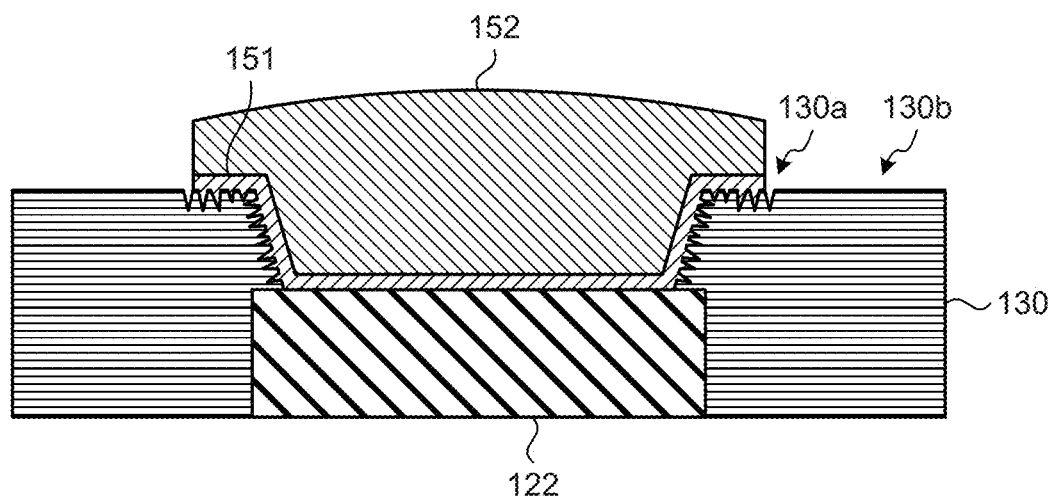
FIG. 22 is a diagram illustrating a specific example of an etching step.

Thus, etching is performed on the seed layer 151 by using the post 152 as a mask (Step S207). Specifically, the seed layer 151 that is formed on the upper surface of the solder resist layer 130 is immersed in an etching solution that selectively dissolve, for example, copper and, for example, as illustrated in FIG. 22, the seed layer 151 corresponding to a portion that is associated with the unneeded portion on the seed layer and that does not overlap with the post 152 is removed. As a result, the connection terminal 150 that is connected to the wiring layer 122 and that is constituted by the seed layer 151 and the post 152 is formed.

In a process of etching the seed layer 151, the seed layer 151 corresponding to the portion that is associated with the unneeded portion is dissolved and, at the same time, the both sides of the seed layer 151 overlapping with the post 152 are dissolved caused by the progress of the process of side etching. However, in the area that overlaps with the post 152, the seed layer 151 is formed at the roughened portion 130*a* of the surface of the solder resist layer 130, and thus, the progress of the process of side etching is relatively slow. In other words, because the creepage distance of the roughened portion 130*a* is long, an etching solution is prevented from entering the seed layer 151 on the roughened portion 130*a*, and thus, an amount of side etching of the seed layer 151 is reduced. As a result, an amount of the seed layer 151 that overlaps with the post 152 to be dissolved is reduced, and an undercut of the connection terminal 150 is accordingly reduced. Consequently, the connection terminal 150 is reliably fixed on the surface of the solder resist layer 130, and it is thus possible to improve the connection reliability between the connection terminal 150 and the wiring layer 122.

As described above, according to the embodiment, when an opening portion is formed, by performing laser beam machining, on an insulating layer that is formed of a resin, the property of the resin present in the surrounding area of the opening portion is allowed to be changed by laser irradiation, and, when a resin residue is removed by a desmear process, the portion in the surrounding area of the opening portion that is changed in property is roughened. Then, a seed layer is formed on the surface of the insulating layer including the portion in the surrounding area of the opening portion, a connection terminal or a via is formed by performing electrolytic plating on the seed layer, and a portion associated with the unneeded portion on the seed layer is removed by performing etching. Consequently, when etching is performed on the portion associated with the unneeded portion on the seed layer, an etching solution is prevented from entering the surrounding area of the roughened opening portion, and it is thus possible to reduce an amount of side etching of the seed layer that overlaps with the electrolytic plating. As a result, it is possible to reliably fix the connection terminal or the via to the surface of the insulating layer, and it is thus possible to improve the connection reliability of the connection terminal or the via.

In addition, in one embodiment described above, it is assumed that the property of the resin in the surrounding area of the opening portion of the insulating layer is changed by laser irradiation, and it is assumed that the surface of the insulating layer is roughened by the desmear process that is performed on the surrounding area of the opening portion that is changed in property. However, a method of roughening the surface of the insulating layer is not limited to the method described above. For example, after the opening portion is formed on the insulating layer, the surrounding area of the opening portion may be roughened by masking a portion corresponding to a smoothed portion that is other than the portion of the surrounding area of the opening portion by using, for example, DFR or the like, and, performing, for example, a dry desmear process on the surrounding area of the opening portion that is not masked.

Figure 23:
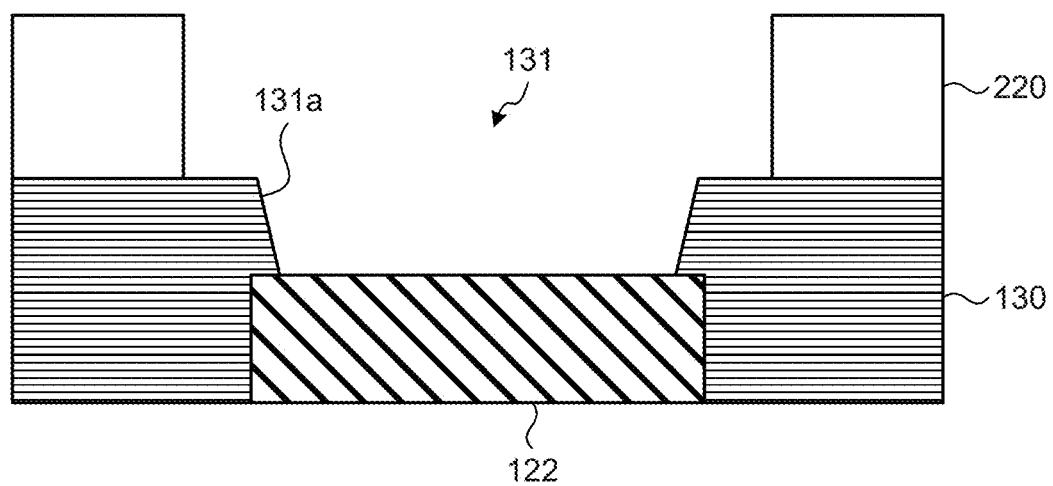
FIG. 23 is a diagram illustrating a specific example of a masking step.

In this case, for example, if the solder resist layer 130 is formed by using the insulating resin, the opening portion 131 is formed on the solder resist layer 130, and a mask is formed in the surrounding area of the opening portion 131 by performing, for example, DFR. In other words, for example, as illustrated in FIG. 23, the surface of the solder resist layer 130 excluding the inner wall surface 131*a* of the opening portion 131 and the surrounding area of the opening portion 131 are masked by a DFR 220.

Figure 24:
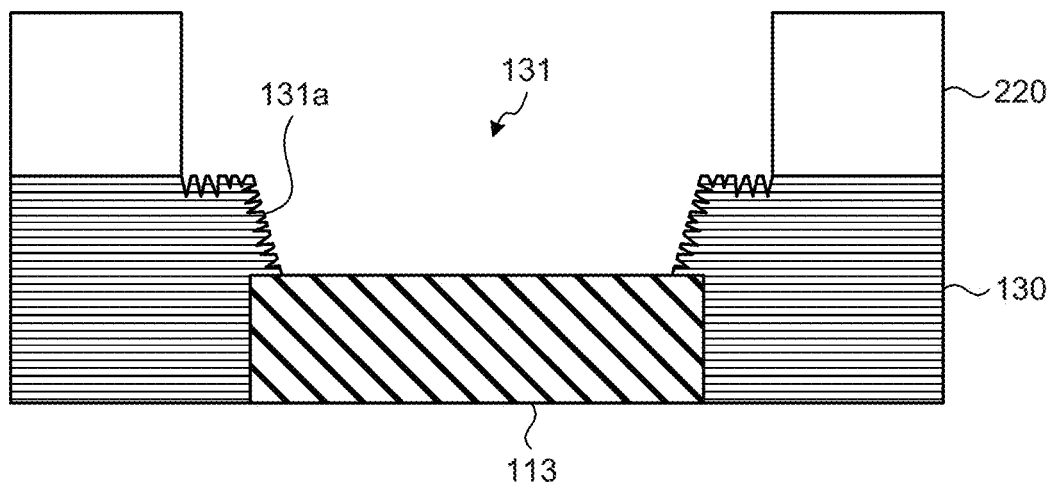
FIG. 24 is a diagram illustrating a specific example of a dry desmear processing step.

Then, a dry desmear process is performed in order to remove a resin residue remaining on the bottom surface or the inner wall surface 131*a* of the opening portion 131 or the surrounding area of the opening portion 131. The dry desmear process is a type of a plasma treatment, and in which micro etching is performed on a resin on the surface of the insulating layer by using, for example, $CF_4$ (carbon tetrafluoride) gas. Consequently, for example, as illustrated in FIG. 24, the surface of the solder resist layer 130 is roughened at the inner wall surface 131*a* of the opening portion 131 and the surrounding area of the opening portion 131 that are exposed from the DFR 220 caused by the dry desmear process.

Figure 25:
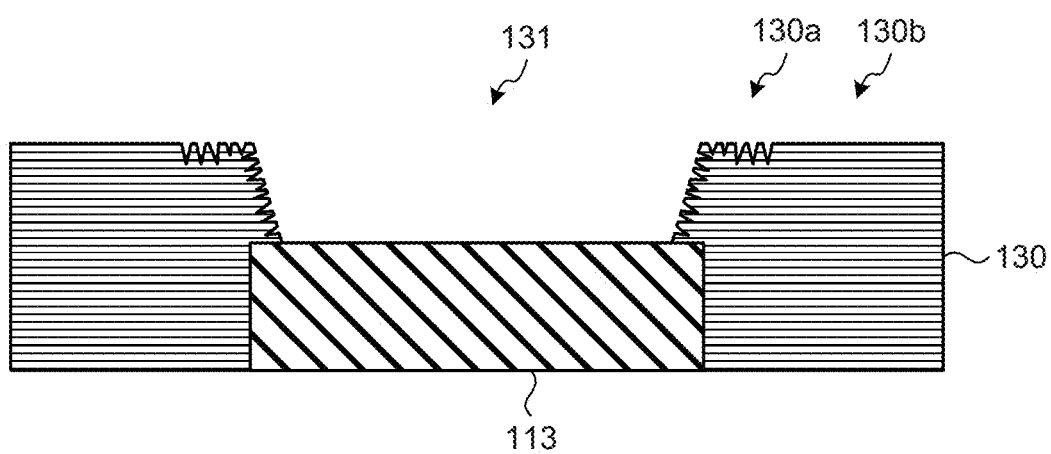
FIG. 25 is a diagram illustrating a specific example of a processing step of removing a mask.

Thereafter, for example, as illustrated in FIG. 25, when the mask using the DFR 220 is removed, the roughened portion 130*a* and the smoothed portion 130*b* are formed on the surface of the solder resist layer 130. In other words, the roughened portion 130*a* is formed on the surface of the solder resist layer 130 in the surrounding area of the surface of the opening portion 131, and the surface roughness is larger than the smoothed portion 130*b* that is the other portion.

According to the method described above, although a step of masking using the DFR and a step of removing the mask are added, even in a case where the opening portion is formed on the insulating layer by exposure or image development, it is possible to roughen the surrounding area of the opening portion, and it is thus possible to use a photosensitive resin as a material of the insulating layer.

Furthermore, in one embodiment described above, it is assumed that the connection terminal 150 is constituted by the seed layer 151 and the post 152; however, it may be possible to form a surface processing layer obtained by performing, for example, nickel plating, palladium plating, gold plating, or the like on the upper surface of the connection terminal 150. The surface processing layer is formed on the upper surface of the connection terminal 150, so that, when the electrodes 181 of, for example, the semiconductor chip 180 is bonded to the connection terminal 150 by soldering, it is possible to enhance the solder wetting characteristics.

Furthermore, in one embodiment described above, a description has been made by using an example of the wiring substrate 100 in which the multi-layer wiring structure 120 is formed on the core substrate 110 by using a buildup technique. However, the present invention may be applied to a coreless wiring substrate that does not have the core substrate 110.

According to an aspect of an embodiment of the wiring substrate and the method of manufacturing the wiring substrate disclosed in the present invention, an advantage is provided in that it is possible to improve the connection reliability.

With respect to the embodiments and the variety thereof described above, the following notes are further disclosed.

(Note 1) A method of manufacturing a wiring substrate, the method including:
laminating an insulating layer on a wiring layer;
forming an opening portion that passes through the insulating layer to the wiring layer;
roughening a part of a surface of the insulating layer including an inner wall surface of the opening portion;
forming an electric conductor film on the surface of the insulating layer; and
removing an unneeded portion of the electric conductor film by performing etching.

(Note 2) The method of manufacturing a wiring substrate according to Note 1, wherein
the forming the opening portion includes
forming the opening portion and changing properties of the part of the surface of the insulating layer including the inner wall surface of the opening portion by irradiating the insulating layer with a laser, and
the roughening includes roughening a part of the surface of the insulating layer in which the properties are changed by a desmear process performed by using a chemical solution.

(Note 3) The method of manufacturing a wiring substrate according to Note 1, wherein
the roughening includes
forming a mask on the surface of the insulating layer excluding the part, and
roughening the part by performing micro etching on the surface of the insulating layer by performing a dry desmear process that uses plasma, and
removing the mask.

(Note 4) The method of manufacturing a wiring substrate according to Note 1, wherein
the forming the electric conductor film includes:
forming a first electric conductor film on the surface of the insulating layer, the inner wall surface of the opening portion and a surface of the wiring layer that is exposed from the opening portion;
forming a resist layer on the first electric conductor film such that a portion of the first electric conductor film around the opening portion and on the inner wall of the opening portion is exposed;
forming a second electric conductor film on the portion of the first electric conductor film exposed from the resist layer; and
removing the resist layer, and
the removing the unneeded portion includes
removing an unneeded portion of the first electric conductor film that is exposed from the second electric conductor film.

(Note 5) The method of manufacturing a wiring substrate according to Note 4, wherein
the first electric conductor film is formed by performing electroless plating or sputtering, and
the second electric conductor film is formed by performing electrolytic plating using power feeding from the first electric conductor film.

(Note 6) The method of manufacturing a wiring substrate according to Note 4, wherein
the removing the unneeded portion of the first electric conductor film includes locating a side surface of the first electric conductor film farther inward than a side surface of the second electric conductor film.

(Note 7) The method of manufacturing a wiring substrate according to Note 1, wherein
the forming the electric conductor film includes forming a connection terminal that is connected to the wiring layer and protrudes from the opening portion by filling the electric conductor film in the opening portion.

(Note 8) The method of manufacturing a wiring substrate according to Note 1, wherein
the forming the electric conductor film includes forming a via that connects another wiring layer that is formed on the insulating layer to the wiring layer by filling the electric conductor film in the opening portion.

(Note 9) The method of manufacturing a wiring substrate according to Note 1, wherein
the roughening includes forming a roughened portion on the inner wall surface of the opening portion and on the surface of the insulating layer around the opening portion, and
the roughened portion has surface roughness that is 1.5 to 50 times larger than surface roughness of the surface of the insulating layer other than the roughened portion.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A wiring substrate comprising:
a wiring layer;
an insulating layer that is laminated on the wiring layer;
an opening portion that passes through the insulating layer to the wiring layer; and
an electric conductor film that is formed at the opening portion of the insulating layer, wherein
a surface of the insulating layer includes
a smoothed portion that is not covered by the electric conductor film, and
a roughened portion that is covered by the electric conductor film and that has surface roughness that is greater than surface roughness of the smoothed portion,
the roughened portion is provided on the surface of the insulating layer around the opening portion and on an inner wall surface of the opening portion,
the electric conductor film includes
a first electric conductor film that covers the surface of the insulating layer around the opening portion, the inner wall surface of the opening portion and a surface of the wiring layer that is exposed from the opening portion, and
a second electric conductor film that is laminated on the first electric conductor film, and
a side surface of the first electric conductor film on the surface of the insulating layer around the opening portion is located farther inward than a periphery of the roughened portion on the surface of the insulating layer around the opening portion and a side surface of the second electric conductor film.

2. The wiring substrate according to claim 1, wherein the roughened portion has surface roughness that is 1.5 to 50 times larger than surface roughness of the smoothed portion.

3. The wiring substrate according to claim 1, wherein the electric conductor film is connected to the wiring layer and protrudes from the opening portion of the insulating layer to form a connection terminal.

4. The wiring substrate according to claim 1, wherein the electric conductor film forms a via that connects another wiring layer that is formed on the insulating layer to the wiring layer.

5. The wiring substrate according to claim 1, wherein the roughened portion is provided on an area surrounding the opening portion on the surface of the insulating layer.

6. The wiring substrate according to claim 1, wherein the insulating layer includes an insulating resin.

7. The wiring substrate according to claim 1, wherein the first electric conductor film includes an electroless plating film or a sputtering film, and the second electric conductor film includes an electrolytic plating film.

8. The wiring substrate according to claim 1, wherein the roughened portion is provided continuously from the surface of the insulating layer outside of and around the opening portion to the inner wall surface of the opening.

9. The wiring substrate according to claim 1, wherein a part of the roughened portion extends beyond the side surface of the electric conductor film and is exposed from the electric conductor film.

10. The wiring substrate according to claim 1, wherein the second electric conductor film is continuously laminated on portions of the first electric conductor film that cover the surface of the insulating layer around the opening portion, the inner wall surface of the opening portion and the surface of the wiring layer that is exposed from the opening portion, and
the side surface of the second electric conductor film is provided on the first electric conductor film on the surface of the insulating layer around the opening portion.

11. The wiring substrate according to claim 1, wherein the side surface of the second electric conductor film is provided on the first electric conductor film on the surface of the insulating layer around the opening portion.

12. The wiring substrate according to claim 1, wherein the first electric conductor film is disposed between the second electric conductor film and the insulating layer.

13. The wiring substrate according to claim 10, wherein the first electric conductor film is disposed between the second electric conductor film and the insulating layer.

14. The wiring substrate according to claim 11, wherein the first electric conductor film is disposed between the second electric conductor film and the insulating layer.

\* \* \* \* \*